(12) United States Patent
Hsieh

(10) Patent No.: US 7,562,317 B2
(45) Date of Patent: Jul. 14, 2009

(54) MULTITASKING CIRCUIT LAYOUT DIAGRAM SILKSCREEN TEXT HANDLING METHOD AND SYSTEM

(75) Inventor: Hsiang-Yi Hsieh, Taipei (TW)

(73) Assignee: Inventec Corporation, Taipei (TW)

( * ) Notice: Subject to any disclaimer, the term of this patent is extended or adjusted under 35 U.S.C. 154(b) by 288 days.

(21) Appl. No.: 11/548,806

(22) Filed: Oct. 12, 2006

(65) Prior Publication Data

US 2008/0092102 A1    Apr. 17, 2008

(51) Int. Cl.
*G06F 17/50* (2006.01)
(52) U.S. Cl. .................. 716/1; 716/3; 716/11
(58) Field of Classification Search ...... 716/1, 716/3, 11
See application file for complete search history.

(56) References Cited

U.S. PATENT DOCUMENTS

2002/0083400 A1 *   6/2002   Chung et al. ............... 716/3

* cited by examiner

*Primary Examiner*—Vuthe Siek

(57) ABSTRACT

A multitasking circuit layout diagram silkscreen text handling method and system is proposed, which is designed for use in conjunction with a computer platform that runs a CAD (Computer-Aided Design) circuit layout design program, for providing a CAD-created circuit layout diagram with a multitasking silkscreen text handling capability, which is characterized in that the task of the definition and modification of the silkscreen text associated with the circuit layout diagram can be conducted by multiple users separately from the task of the modification of the contents of the circuit layout diagram. By the prior art, these two tasks are inherently related to each other. This feature allows the circuit layout design with CAD to be less laborious and time-consuming and thus more efficient.

9 Claims, 4 Drawing Sheets

MULTITASKING CIRCUIT LAYOUT DIAGRAM SILKSCREEN TEXT HANDLING METHOD AND SYSTEM

BACKGROUND OF THE INVENTION

1. Field of the Invention

This invention relates to information technology (IT), and more particularly, to a multitasking circuit layout diagram silkscreen text handling method and system which is designed for use in conjunction with a computer platform for providing a silkscreen text handling function to a CAD (Computer-Aided Design) generated circuit layout diagram.

2. Description of Related Art

In the industry of electronics, the design of circuit boards typically utilizes a CAD (Computer-Aided Design) software program to draw the required circuit layout diagrams which are then used in automated processes to control the manufacture of circuit boards. The Allegro software program developed by the Cadence Corporation of USA, for example, is a widely employed CAD system that can help manufacturers in the layout design of circuit boards.

In practice, the circuit layout diagram of a computer motherboard or expansion card often needs to add some text-based data beside the circuit components, such as the serial numbers of the circuit components. This text-based data is customarily called "silkscreen". When a circuit board is manufactured from the circuit layout diagram, the silkscreen text is produced by printing white paint onto the circuit board. In a circuit layout diagram generated by the Allegro CAD system, the silkscreen text is embedded in its associated circuit shape.

In practice, it is desired that the design of circuit shape and the design of silkscreen be separately conducted by different staff members. One drawback to the Allegro CAD circuit layout design system, however, is that the design of silkscreen is inherently associated with the design of circuit shape, and therefore cannot be separately multitasked. Since the Allegro CAD circuit layout design system lacks such a multitasking capability, the silkscreen text can be defined only during the importation of its associated circuit shape into the circuit layout diagram and pasted at specified location on the circuit layout diagram.

One drawback to the above-mentioned practice, however, is that when a circuit layout design engineer wants to modify the silkscreen text of a certain circuit shape on the circuit layout diagram, the operation includes a first step of deleting the circuit shape from the circuit layout diagram, a second step of importing the original version of the deleted circuit shape, and a third step of redefining the silkscreen text during the importation of the circuit shape. This practice is undoubtedly quite tedious, laborious, and time-consuming for the user to implement. Moreover, if the circuit shape has been modified after being imported to the circuit layout diagram, the imported original version of the circuit shape needs to be modified again. This repeated work makes the CAD operation even more laborious and inefficient.

SUMMARY OF THE INVENTION

It is therefore an objective of this invention to provide a multitasking circuit layout diagram silkscreen text handling method and system which allows the design of circuit shape and the design of its associated silkscreen to be multitasked separately and independently, so that the modification of silkscreen text will not involve the modification of its associated circuit shape.

The multitasking circuit layout diagram silkscreen text handling method and system according to the invention is designed for use in conjunction with a computer platform running a CAD program, such as the Allegro CAD circuit layout design system, for providing a silkscreen text handling function to the circuit layout diagram created by the CAD circuit layout design system.

The multitasking circuit layout diagram silkscreen text handling method according to the invention comprises: (S1) responding to a user-operated circuit shape creating event by creating a circuit shape with a set of user-defined silkscreen layout attributes; (S2) responding to a user-operated silkscreen data defining event by defining a silkscreen text file for the associated silkscreen of each created circuit shape; (S3) responding to a user-operated circuit shape importing event by importing each circuit shape into the circuit layout diagram; and (S4) responding to a user-operated silkscreen data importing event by importing the silkscreen text file associated with the imported circuit shape into the circuit layout diagram, and then finding the circuit shape that is associated with the imported silkscreen text file and pasting the imported silkscreen text on the circuit layout diagram in a manner according to the predefined silkscreen layout attributes of the circuit shape In concrete architecture, the multitasking circuit layout diagram silkscreen text handling system according to the invention comprises: (A) a circuit shape creating module, which is capable of providing a user-operated circuit shape creating function for creating a circuit shape with a set of user-defined silkscreen layout attributes; (B) a silkscreen text defining module, which is capable of providing a user-operated silkscreen text defining function for defining a silkscreen text file for the associated silkscreen of each circuit shape created by the circuit shape creating module; (C) a circuit shape importing module, which is capable of providing a user-operated circuit shape importing function for importing each circuit shape created by the circuit shape creating module into the circuit layout diagram; and (D) a silkscreen text importing module, which is capable of providing a user-operated silkscreen text importing function for importing the silkscreen text file defined by the silkscreen text defining module into the circuit layout diagram, and which is capable of finding the circuit shape that is associated with the imported silkscreen text file and pasting the imported silkscreen text on the circuit layout diagram in a manner according to the predefined silkscreen layout attributes of the circuit shape.

The multitasking circuit layout diagram silkscreen text handling method and system according to the invention is characterized in that the task of the definition and modification of the silkscreen text associated with the circuit layout diagram can be conducted by multiple users separately from the task of the modification of the contents of the circuit layout diagram. By the prior art, these two tasks are inherently related to each other. This feature allows the circuit layout design with CAD to be less laborious and time-consuming and thus more efficient.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The multitasking circuit layout diagram silkscreen text handling method and system according to the invention is disclosed in full details by way of preferred embodiments in the following with reference to the accompanying drawings.

Figure 1:
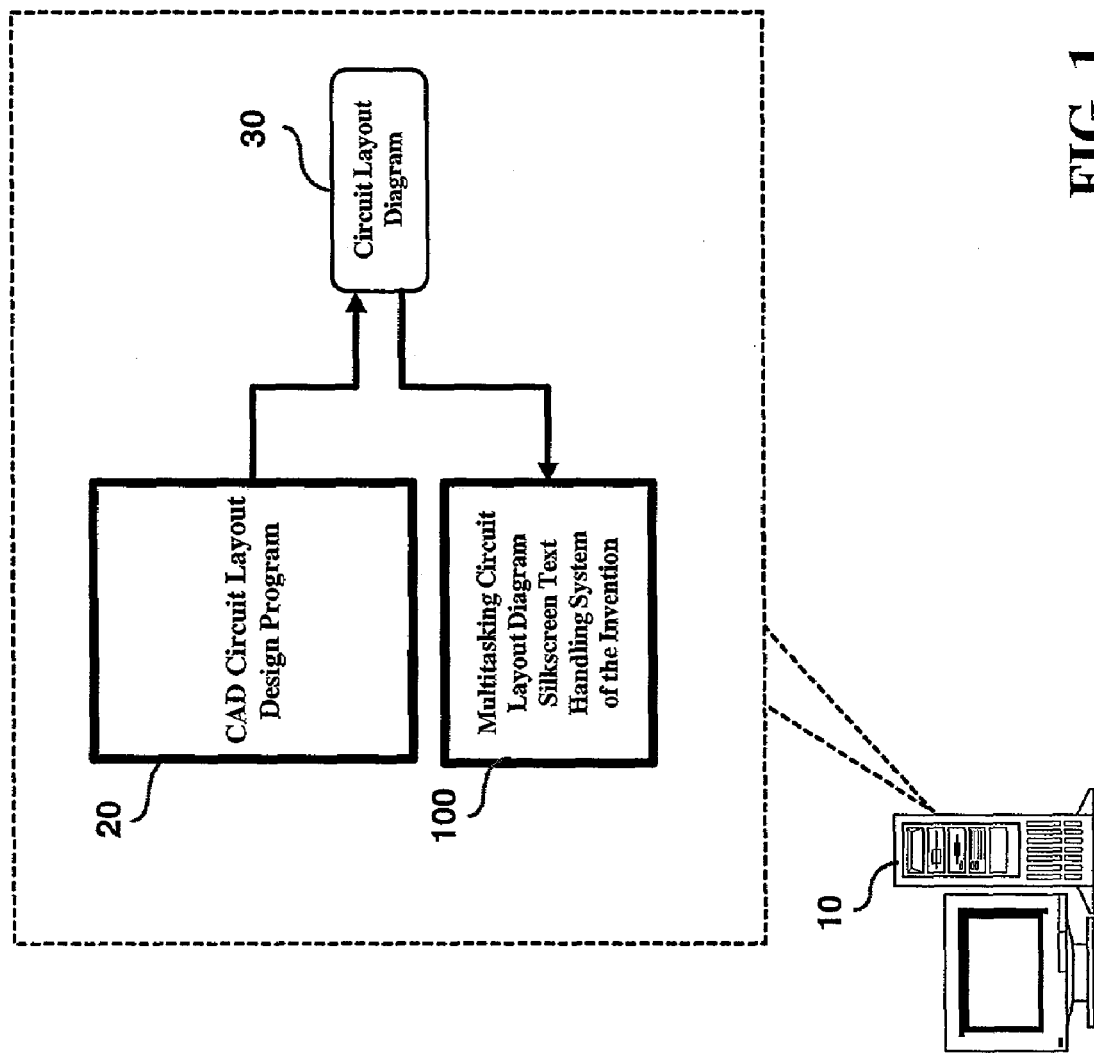
FIG. 1 is a schematic diagram showing the application of the multitasking circuit layout diagram silkscreen text handling system of the invention with a computer platform.

FIG. 1 is a schematic diagram showing the application of the multitasking circuit layout diagram silkscreen text handling system according to the invention (which is here encapsulated in a box indicated by the reference numeral 100). As shown, the multitasking circuit layout diagram silkscreen text handling system of the invention 100 is designed for use in conjunction with a computer platform 10, such as a network server, a desktop computer, or a notebook computer, that is installed with a CAD (Computer-Aided Design) circuit layout design program 20, such as the Allegro CAD circuit layout design system developed by the Cadence Corporation of USA. Functionally, the multitasking circuit layout diagram silkscreen text handling system of the invention 100 is capable of providing a silkscreen text handling function to a circuit layout diagram 30 created by the CAD circuit layout design program 20.

Figure 3:
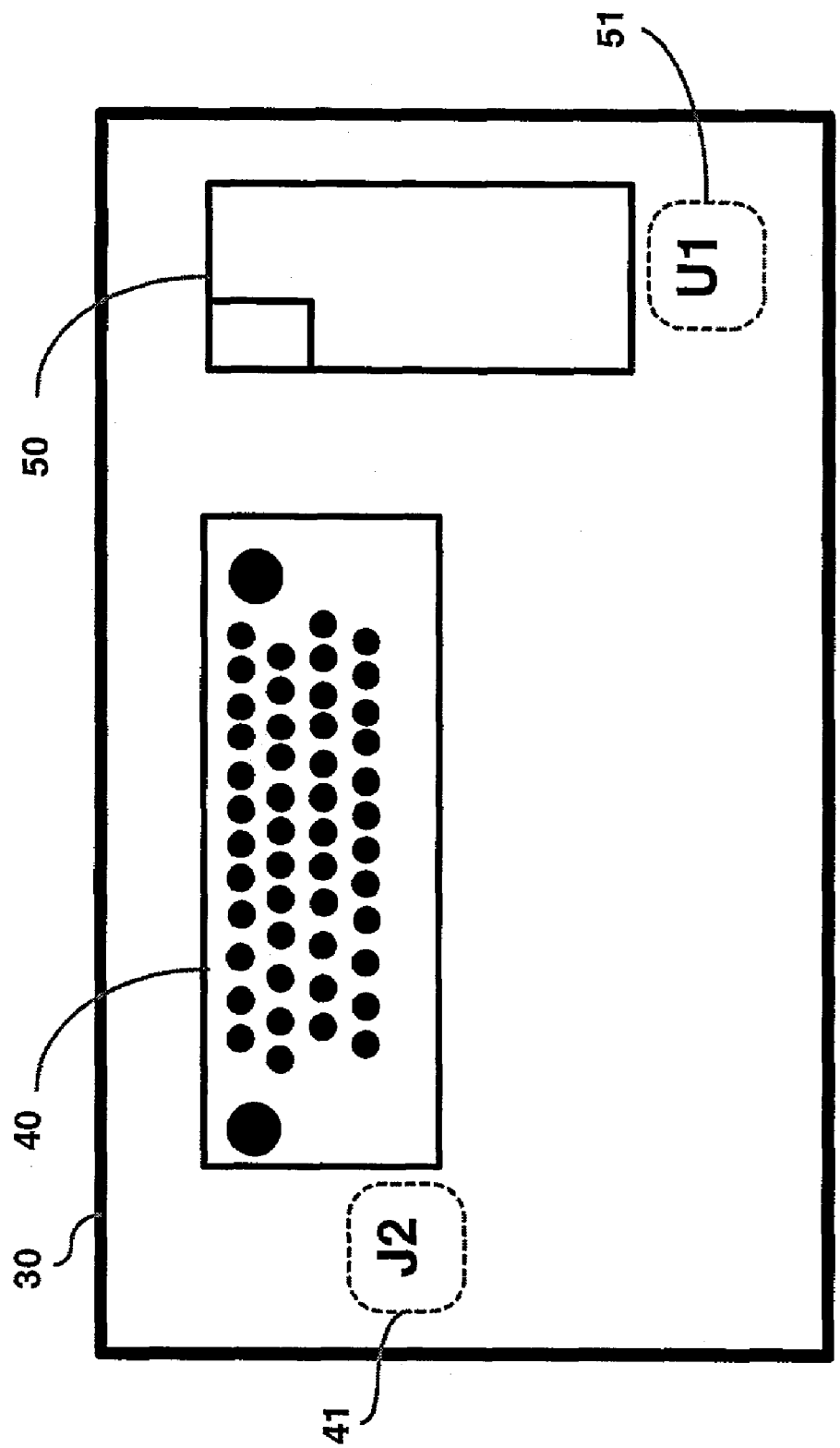
FIG. 3 is a schematic diagram showing an example of a circuit layout diagram.

In practical applications, for example, as illustrated in FIG. 3, the circuit layout diagram 30 contains one or more circuit shapes 40, 50 that are created by the CAD circuit layout design program 20, where the first circuit shape 40 is associated with a silkscreen 41 whose text content is "J2", while the second circuit shape 50 is associated with another silkscreen 51 whose text content is "U1" (It is to be noted that FIG. 3 is only intended for demonstrative purpose; and in practice, the circuit layout diagram 30 may contain various other circuit shapes).

Figure 2:
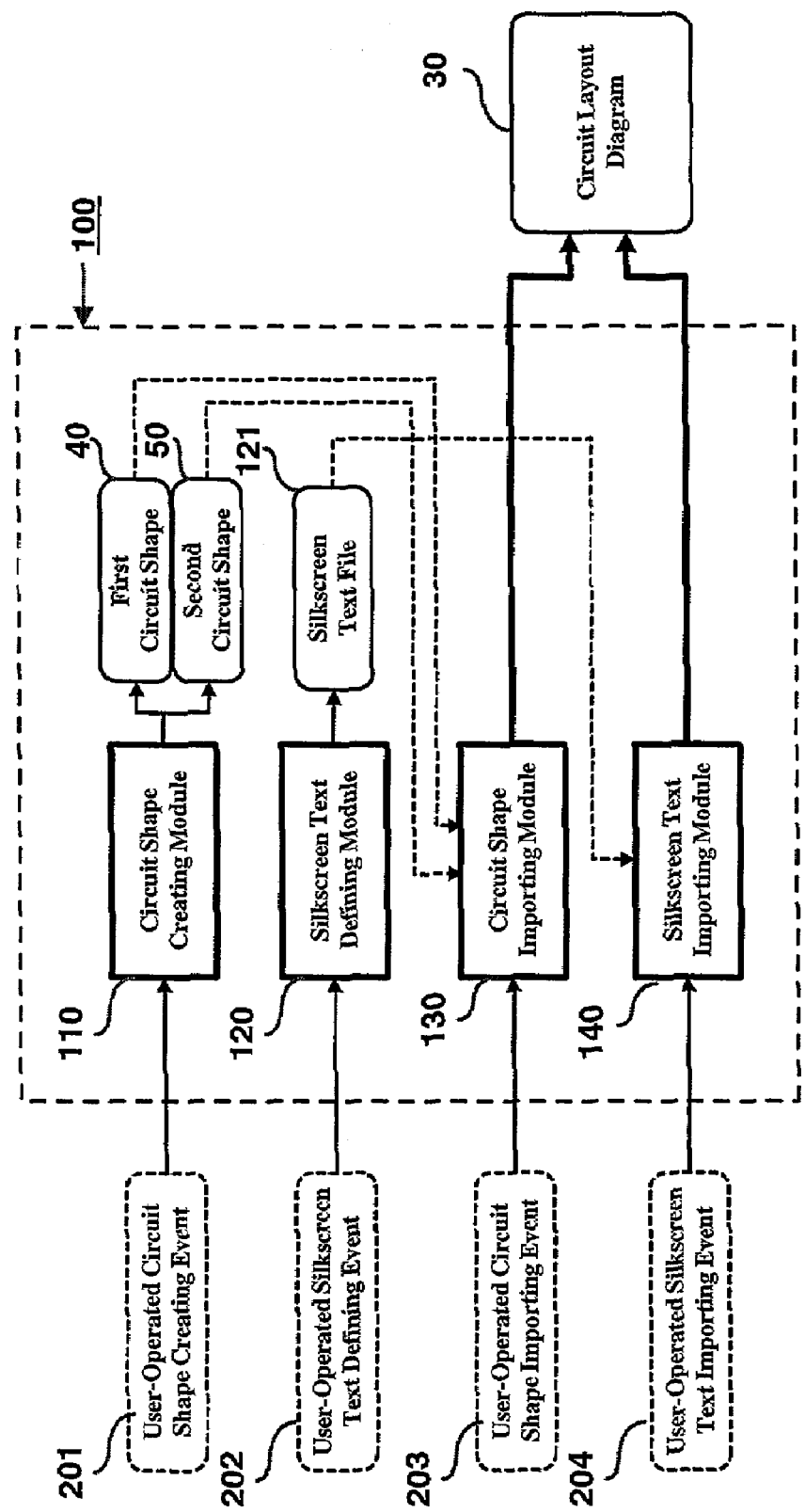
FIG. 2 is a schematic diagram showing the architecture of the multitasking circuit layout diagram silkscreen text handling system of the invention.

As shown in FIG. 2, in architecture, the multitasking circuit layout diagram silkscreen text handling system of the invention 100 comprises: (A) a circuit shape creating module 110; (B) a silkscreen text defining module 120; (C) a circuit shape importing module 130; and (D) a silkscreen text importing module 140.

The circuit shape creating module 110 is capable of providing a user-operated circuit shape creating function for the user to create one or more circuit shapes 40, 50 (here the term "circuit shape" means the graphical representation of a circuit component). The user-initiated action is here represented as a user-operated circuit shape creating event 201 in FIG. 2. In addition, the user should further define a set of silkscreen layout attributes for each of the circuit shapes 40, 50, including position (i.e., coordinates), text format, size, and angle of rotation.

The silkscreen text defining module 120 is capable of providing a user-operated silkscreen text defining function for the user to define a silkscreen text file 121 for the associated silkscreen of each of the circuit shapes 40, 50 created by the circuit shape creating module 110. The user-initiated action is here represented as a user-operated silkscreen text defining event 202 in FIG. 2. In the example of FIG. 3, the silkscreen text of the first circuit shape 40 is defined to be "J2", while the silkscreen text of the second circuit shape 50 is defined to be "U1". The silkscreen text file 121 is a separate file from the circuit shapes 40, 50, i.e., the silkscreen text file 121 is not embedded in or linked to the circuit shapes 40, 50.

The circuit shape importing module 130 is capable of providing a user-operated circuit shape importing function for the user to import each of the circuit shapes 40, 50 created by the circuit shape creating module 110 into the circuit layout diagram 30. The user-initiated action is here represented as a user-operated circuit shape importing event 203 in FIG. 2. Each of the imported circuit shapes 40, 50 is then laid at a predefined position on the circuit layout diagram 30.

The silkscreen text importing module 140 is capable of providing a user-operated silkscreen text importing function for the user to import the silkscreen text file 121 defined by the silkscreen text defining module 120 into the circuit layout diagram 30. The user-initiated action is here represented as a user-operated silkscreen text importing event 204 in FIG. 2. When a silkscreen text file 121 is imported, the silkscreen text importing module 140 can automatically find the circuit shape that is associated with the imported silkscreen text file 121 and then paste the imported silkscreen text on the circuit layout diagram 30 in accordance with the layout attributes (i.e., coordinates, text format, size, and angle of rotation) associated with that circuit shape.

The following is a detailed description of a practical application example of the multitasking circuit layout diagram silkscreen text handling system of the invention 100 during actual operation. In this application example, it is assumed that the layout design and the silkscreen design for a circuit board are separately conducted by two different engineers, where the layout design is conducted by a first engineer and the silkscreen design is conducted by a second engineer.

In actual use, the first engineer is responsible for the creation of the circuit shapes 40, 50 by using the circuit shape creating module 110. In FIG, 2, the user-operated action conducted by the first engineer is represented as a user-operated circuit shape creating event 201, and the circuit shape creating module 110 will respond to the user-operated circuit shape creating event 201 by creating the circuit shapes 40, 50. In addition, the first engineer needs to define a set of silkscreen layout attributes for each of the circuit shapes 40, 50, where the silkscreen layout attributes include position (i.e., coordinates), text format, size, and angle of rotation, and which are embedded to the data contents of the circuit shapes 40, 50.

At the same time, the second engineer is responsible for the definition of a silkscreen text file 121 for each of the circuit shapes 40, 50 by using the silkscreen text defining module 120. In FIG, 2, the user-operated action conducted by the second engineer is represented as a user-operated silkscreen text defining event 202, and the circuit shape creating module 110 will respond to the user-operated silkscreen text defining event 202 by creating the silkscreen text file 121. In this application example, the second engineer defines the silkscreen text of the first circuit shape 40 to be "J2" and the silkscreen text of the second circuit shape 50 to be "U1" by inputting text.

When the circuit shapes 40, 50 and associated silkscreen text are completed, a third engineer is responsible for importing the circuit shapes 40, 50 and associated silkscreen text file 121 into the circuit layout diagram 30. The first step is to import the circuit shapes 40, 50 into the circuit layout diagram 30 by using the circuit shape importing module 130. In FIG. 2, the user-operated action conducted by the third engineer is represented as a user-operated circuit shape importing event 203, and the circuit shape importing module 130 will respond to the user-operated circuit shape importing event 203 by importing the circuit shapes 40, 50 to the circuit layout diagram 30 and paste them at predefined locations. Next, a user-operated silkscreen text importing event 204 is initiated to import the associated silkscreen text of the circuit shapes 40, 50 into the circuit layout diagram 30 through the use of the silkscreen text importing module 140.

When the silkscreen text file 121 is imported, the silkscreen text importing module 140 automatically finds the circuit shape that is associated with the imported silkscreen text file 121 and then paste the imported silkscreen text on the circuit layout diagram 30 in accordance with the layout attributes (i.e., coordinates, text format, size, and angle of rotation) associated with that circuit shape. For example, the first circuit shape 40 is associated with the silkscreen text "J2", while the second circuit shape 50 is associated with the silkscreen text "U1". In this case, as illustrated in FIG. 3, the silkscreen text "J2 is pasted beside the first circuit shape 40, and the silkscreen text "U1" is pasted beside the second circuit shape 50 based on predefined layout attributes embedded in the circuit shapes 40, 50.

Figure 4:
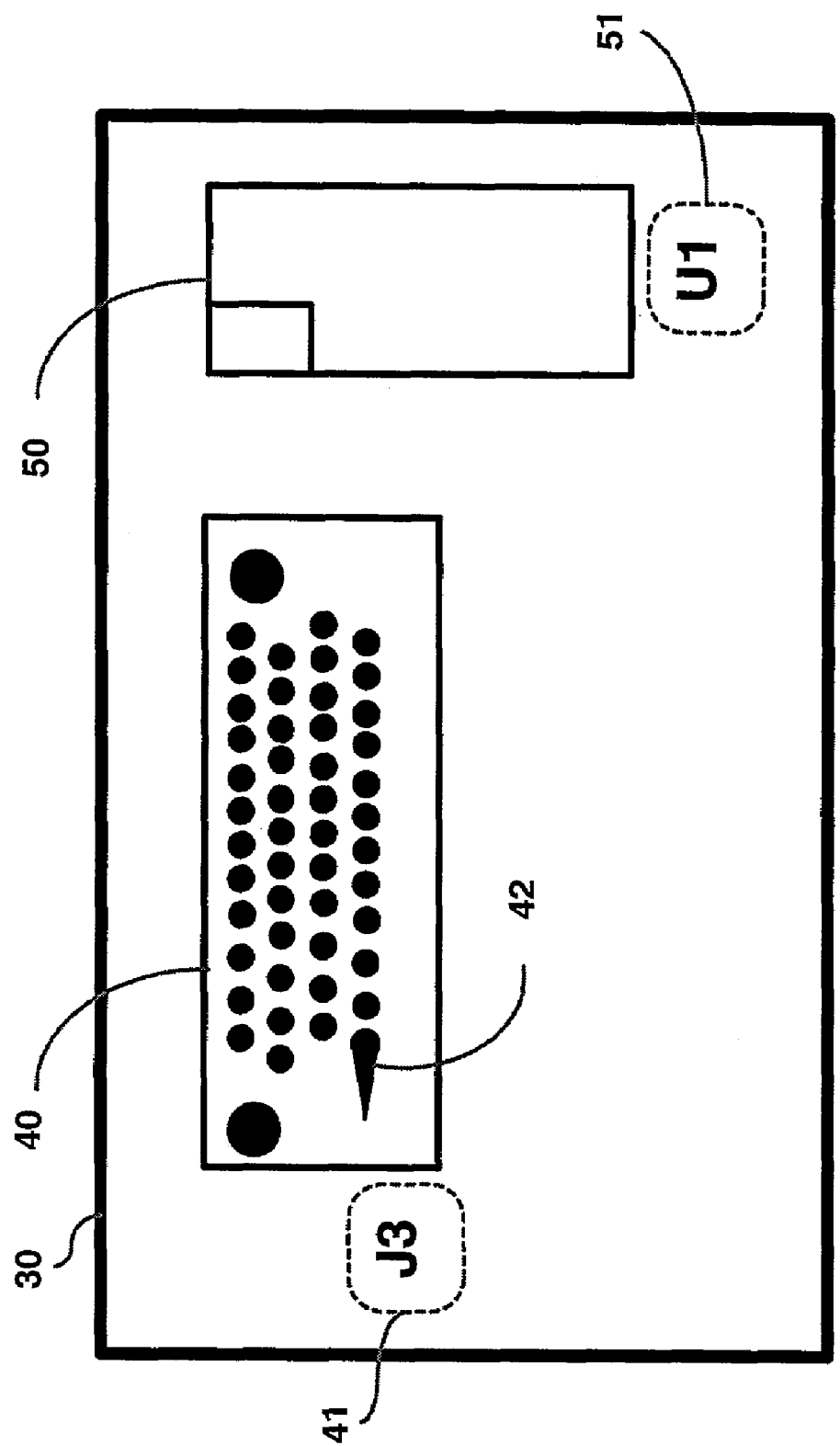
FIG. 4 is a schematic diagram showing the circuit layout diagram of FIG. 3 with a circuit shape and its associated silkscreen text being modified.

If another circuit layout design engineer wants to change the text content of the silkscreen 41 of the first circuit shape 40 from "J2" to "J3", then he/she needs just to use the silkscreen text defining module 120 to modify the contents of the silkscreen text file 121, i.e., modify the text definition in silkscreen text file 121 from "J2" to "J3", and then use the silkscreen text importing module 140 to import the modified silkscreen text file 121 into the circuit layout diagram 30. This will cause the silkscreen 41 of the first circuit shape 40 to be changed from "J2" to "J3" as illustrated in FIG. 4. In this case, if the first circuit shape 40 has been modified after being imported into the circuit layout diagram 30 (the modified portion is designed by the reference numeral 42 in FIG. 4), then during the importing of the silkscreen text file 121, it is unnecessary to first delete the first circuit shape 40 from the circuit layout diagram 30 and then import the original version of the first circuit shape 40 as in the case of the prior art. In other words, the modification of silkscreen text is independent of the modification of its associated circuit shape.

In conclusion, the invention provides a multitasking circuit layout diagram silkscreen text handling method and system which is designed for use with a computer platform for providing a silkscreen text handling function to a circuit layout diagram, and which is characterized in that the task of the definition and modification of the silkscreen text associated with the circuit layout diagram can be conducted by multiple users separately from the task of the modification of the contents of the circuit layout diagram. By the prior art, these two tasks are inherently related to each other. This feature allows the circuit layout design with CAD to be less laborious and time-consuming and thus more efficient. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multitasking circuit layout diagram silkscreen text handling method for use with a computer platform for providing a silkscreen text handling function to a circuit layout diagram, which comprises:
   responding to a user-operated circuit shape creating event by creating a circuit shape with a set of user-defined silkscreen layout attributes by a computer;
   responding to a user-operated silkscreen data defining event by defining a silkscreen text file for the associated silkscreen of each created circuit shape by said computer;
   responding to a user-operated circuit shape importing event by importing each circuit shape into the circuit layout diagram by said computer; and
   responding to a user-operated silkscreen data importing event by importing the silkscreen text file associated with the imported circuit shape into the circuit layout diagram, and then finding the circuit shape that is associated with the imported silkscreen text file and pasting the imported silkscreen text on the circuit layout diagram in a manner according to the predefined silkscreen layout attributes of the circuit shape by said computer.

2. The multitasking circuit layout diagram silkscreen text handling method of claim 1, wherein the silkscreen layout attributes include coordinates, text format, size, and angle of rotation.

3. The multitasking circuit layout diagram silkscreen text handling method of claim 2, wherein the circuit layout diagram is created by a CAD (Computer-Aided Design) circuit layout design system.

4. The multitasking circuit layout diagram silkscreen text handling method of claim 1, wherein each circuit shape is associated with a silkscreen.

5. A multitasking circuit layout diagram silkscreen text handling system for use with a computer platform for providing a silkscreen text handling function to a circuit layout diagram, which comprises:
   a circuit shape creating module, which provides a user-operated circuit shape creating function for creating a circuit shape with a set of user-defined silkscreen layout attributes by a computer;
   a silkscreen text defining module, which provides a user-operated silkscreen text defining function for defining a silkscreen text file for the associated silkscreen of each circuit shape created by the circuit shape creating module by said computer;
   a circuit shape importing module, which provides a user-operated circuit shape importing function for importing each circuit shape created by the circuit shape creating module into the circuit layout diagram by said computer; and
   a silkscreen text importing module, which provides a user-operated silkscreen text importing function for importing the silkscreen text file defined by the silkscreen text defining module into the circuit layout diagram, and which finds the circuit shape that is associated with the imported silkscreen text file and pasting the imported silkscreen text on the circuit layout diagram in a manner according to the predefined silkscreen layout attributes of the circuit shape by said computer.

6. The multitasking circuit layout diagram silkscreen text handling system of claim 5, wherein the silkscreen layout attributes include coordinates, text format, size, and angle of rotation.

7. The multitasking circuit layout diagram silkscreen text handling system of claim 5, wherein the circuit layout diagram is created by a CAD (Computer-Aided Design) circuit layout design system.

8. The multitasking circuit layout diagram silkscreen text handling system of claim 7, which is integrated to the CAD circuit layout design system as an add-on module.

9. The multitasking circuit layout diagram silkscreen text handling system of claim 5, wherein each circuit shape is associated with a silkscreen.

* * * * *